US010299228B1

(12) United States Patent
Wurtenberger et al.

(10) Patent No.: US 10,299,228 B1
(45) Date of Patent: May 21, 2019

(54) WIRELESS RADIO FREQUENCY SYSTEM TO DYNAMICALLY MODIFY AUTOMATIC GAIN CONTROL THRESHOLDS

(71) Applicant: Sprint Communications Company L.P., Overland Park, KS (US)

(72) Inventors: Andrew Mark Wurtenberger, Olathe, KS (US); Sreekar Marupaduga, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 346 days.

(21) Appl. No.: 15/277,091

(22) Filed: Sep. 27, 2016

(51) Int. Cl.
*H04W 52/52* (2009.01)
*H04W 52/36* (2009.01)
*H04W 52/24* (2009.01)
*H04W 84/04* (2009.01)
*H04B 7/155* (2006.01)

(52) U.S. Cl.
CPC ......... *H04W 52/52* (2013.01); *H04W 52/241* (2013.01); *H04W 52/243* (2013.01); *H04W 52/245* (2013.01); *H04W 52/367* (2013.01); *H04B 7/15507* (2013.01); *H04W 84/047* (2013.01)

(58) Field of Classification Search
None
See application file for complete search history.

(56) References Cited

U.S. PATENT DOCUMENTS

| 10,085,223 B1* | 9/2018 | Sung | H04W 52/52 |
| 2001/0048727 A1* | 12/2001 | Schmutz | H03G 3/3052 375/345 |
| 2008/0293360 A1* | 11/2008 | Maslennikov | H04B 7/15578 455/24 |
| 2010/0259327 A1* | 10/2010 | Hou | H03G 3/3052 330/129 |
| 2011/0053543 A1* | 3/2011 | Schultz | H03G 3/3078 455/245.1 |
| 2011/0281601 A1* | 11/2011 | Ahn | H04W 8/24 455/500 |

FOREIGN PATENT DOCUMENTS

WO 2009099786 8/2009

* cited by examiner

*Primary Examiner* — Hassan A Phillips
*Assistant Examiner* — Gautam Sharma

(57) ABSTRACT

The technology described herein enhances the operation of a wireless Radio Frequency (RF) system to dynamically modify Automatic Gain Control (AGC) based on RF characteristics of a received data signal. In one implementation, a method of operating a wireless RF system includes receiving a data signal and applying AGC based on AGC thresholds. The method further includes determining an RF characteristic of the data signal, determining signal inflections and signal magnitudes of the RF characteristic during a time window, and comparing the signal inflections and signal magnitudes to an AGC signal inflection threshold and AGC signal magnitude threshold, respectively. The method further provides widening the AGC thresholds if the signal inflections and signal magnitudes exceed the AGC inflection and magnitude thresholds, respectively.

20 Claims, 6 Drawing Sheets

WIRELESS RADIO FREQUENCY SYSTEM TO DYNAMICALLY MODIFY AUTOMATIC GAIN CONTROL THRESHOLDS

TECHNICAL BACKGROUND

Wireless communication devices are used for voice and video calling, Internet access, media streaming, data messaging, email, and the like. Wireless communication devices use wireless radio frequency (RF) communication systems to transmit data. A typical wireless RF communication network includes systems to exchange user communications between wireless communication devices, service providers, and other end user devices. A popular wireless communication technology is Long Term Evolution (LTE). LTE networks use wireless base stations called evolved Node Bs (eNodeBs) to wirelessly connect UEs to LTE networks.

Wireless repeaters extend the range of the eNodeBs in LTE networks. A wireless repeater receives a wireless signal from the eNodeB, amplifies the received signal, and then transmits the amplified version of the received signal to the UE Likewise, the wireless repeater receives a wireless signal from the UE, amplifies the received signal, and then transmits the amplified version of the signal to the eNodeB. The wireless repeaters are often linked together to form a repeater chain that extends from the LTE eNodeB.

In wireless RF communication systems when a data signal is received at an antenna, it is filtered, amplified, demodulated, and delivered to a baseband unit. However, data signals may have varying signal strengths based on network and environmental conditions. If the received data signal is too weak or strong, automatic gain control (AGC) may be applied to provide a controlled and consistent signal amplitude.

The determination of whether AGC should be applied on a received data signal is usually evaluated against threshold signal strength values. However, applying AGC in situations where there are many signal inflections of great magnitude within a time period may not have the desired effect. In some situations, the signal strength values may have changed before AGC can be applied. Furthermore, applying AGC in repeater systems may have a cascading effect, impacting many users.

OVERVIEW

Examples disclosed herein provide a system, method, hardware, and software to dynamically modify Automatic Gain Control (AGC) thresholds in a wireless Radio Frequency (RF) communication system. The wireless RF system receives a data signal and applies AGC based on AGC thresholds. The wireless RF system further determines an RF characteristic of the data signal. The wireless RF system also determines the signal inflections and the signal magnitudes of the RF characteristic during a time window. The wireless RF system compares the signal inflections to an AGC inflection threshold and compares the signal magnitudes to an AGC magnitude threshold. If the signal inflections exceed the AGC inflection threshold and if the signal magnitudes exceed the AGC magnitude threshold, then the wireless RF system widens the AGC thresholds.

BRIEF DESCRIPTION OF THE DRAWINGS

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

DETAILED DESCRIPTION

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention, and that the features described below can be combined in various ways to form multiple variations of the invention. As a result, the invention is not limited to the specific examples described below, but only by the claims and their equivalents.

Figure 1:
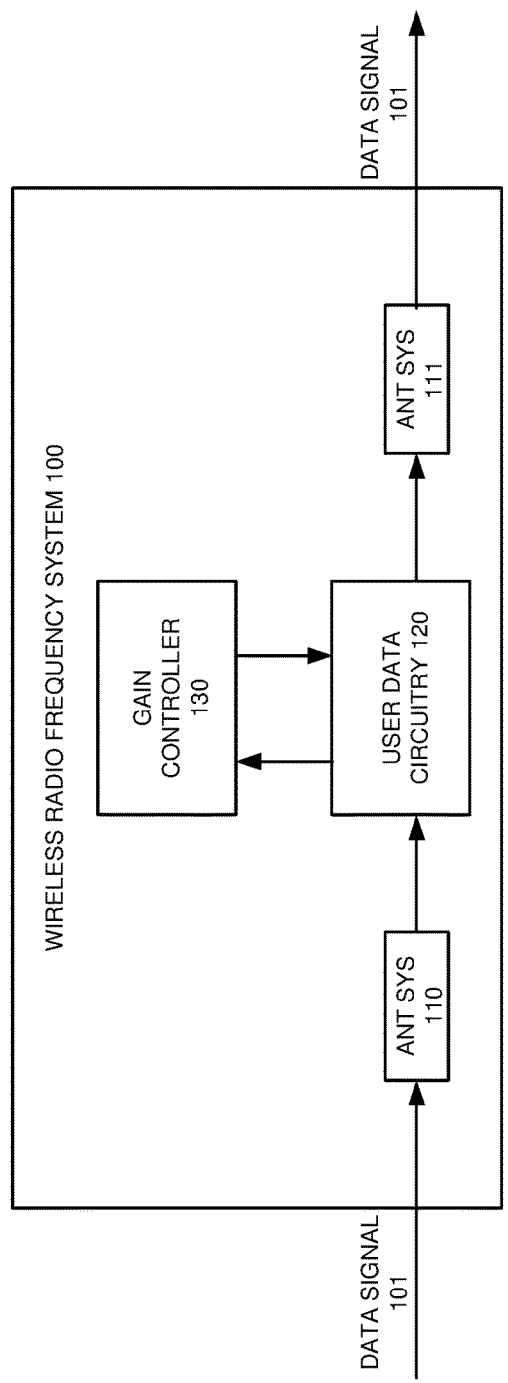
FIG. 1 is a block diagram that illustrates a wireless Radio Frequency (RF) system to dynamically modify Automatic Gain Control (AGC) thresholds.

FIG. 1 illustrates wireless Radio Frequency (RF) system 100 to dynamically modify AGC thresholds. Wireless RF system 100 includes data signal 101, antenna systems 110-111, user data circuitry 120, and gain controller 130. Examples of wireless RF system 100 may include a remote radio head or remote radio unit operatively connected to a cellular base station or evolved Node B (eNode B) that is configured to receive wireless data signals. Further, wireless RF system 100 may be a macro cell, micro cell, nano cell, femto cell, pico cell, or some other form of network cell configured to receive wireless data signals as part of a multi-repeater cascading system. Antenna systems 110-111 may comprise an electromagnetic antenna array, a dipole antenna, or some other form of RF antenna configured to receive/transmit a wireless data signal.

In operation, wireless RF system 100 receives data signal 101 and applies AGC based on AGC thresholds. In some examples, antenna system 110 comprises a receiver and antenna system 111 comprises a transceiver. Wireless RF system 100 determines an RF characteristic of data signal 101. The RF characteristic may be the past signal strength for data signal 101 over a specified period of time. For example, wireless RF system 100 may use signal strength data of data signal 101 from the previous one minute. Wireless RF system 100 determines the signal inflections and the signal magnitudes of the RF characteristic during a time window. For example, wireless RF system 100 may determine the number of inflections and the magnitudes of those inflections for data signal 101 within a one-minute time window.

Wireless RF system 100 compares the signal inflections to an AGC inflection threshold and compares the signal magnitudes to an AGC magnitude threshold. The AGC inflection threshold indicates the number of inflections allowed within the time frame and the AGC magnitude threshold indicates the allowed magnitude of those inflections. For instance, the AGC inflection threshold may be set to four and the AGC magnitude threshold may be set to a delta of 10 db or more. If the signal inflections exceed the AGC inflection threshold and if the signal magnitudes exceed the AGC magnitude threshold, then wireless RF system 100 widens the AGC thresholds. Using the previous example thresholds, wireless RF system 100 would widen the AGC thresholds if there were 4 or more inflections with magnitudes 10 db or greater.

Figure 2:
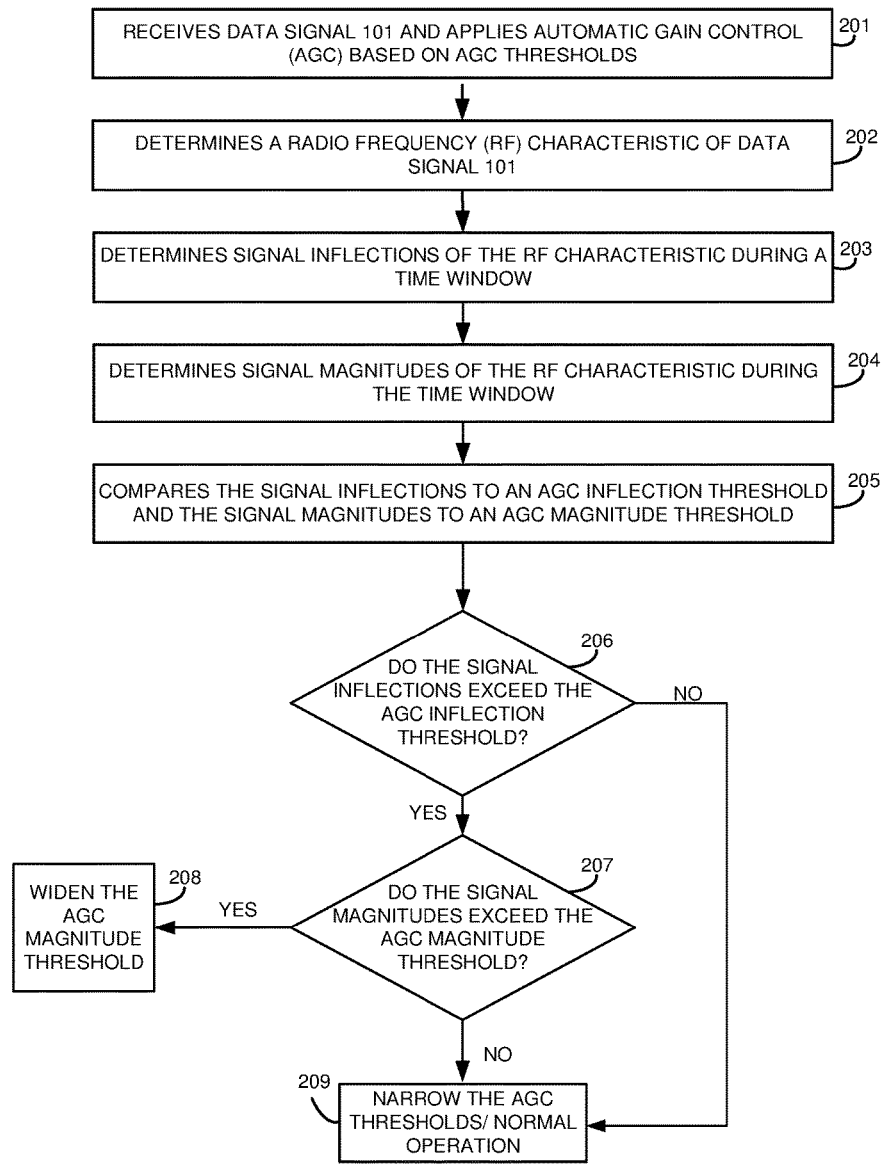
FIG. 2 is a flow diagram that illustrates the operation of the wireless RF system to dynamically modify AGC thresholds.

To further demonstrate the operations of wireless RF system 100, FIG. 2 is provided. FIG. 2 illustrates a method of operating wireless RF system 100 to dynamically modify AGC thresholds. The operations of FIG. 2 are referenced parenthetically in the paragraphs that follow, along with references to the elements and systems from wireless RF system 100 of FIG. 1.

Wireless RF system 100 receives data signal 101 and applies AGC based on AGC thresholds (201). Wireless RF system 101 determines an RF characteristic of data signal 101 (202). Wireless RF system 101 determines the signal inflections of the RF characteristic during a time window (203). Wireless RF system 101 determines the signal magnitudes of the RF characteristic during the time window (204). Wireless RF system 100 compares the signal inflections to an AGC inflection threshold and compares the signal magnitudes to an AGC magnitude threshold (205).

If the signal inflections exceed the AGC inflection threshold (206) and if the signal magnitudes exceed the AGC magnitude threshold (207), then wireless RF system 100 widens the AGC thresholds (208). If the signal inflections do not exceed the AGC inflection threshold (206) or if the signal magnitudes do not exceed the AGC magnitude threshold (207), then wireless RF system 100 continues with normal operation or narrows the AGC thresholds (209). In some examples, wireless RF system 100 needs to narrow the AGC control thresholds to return the system back to normal operation.

Figure 3:
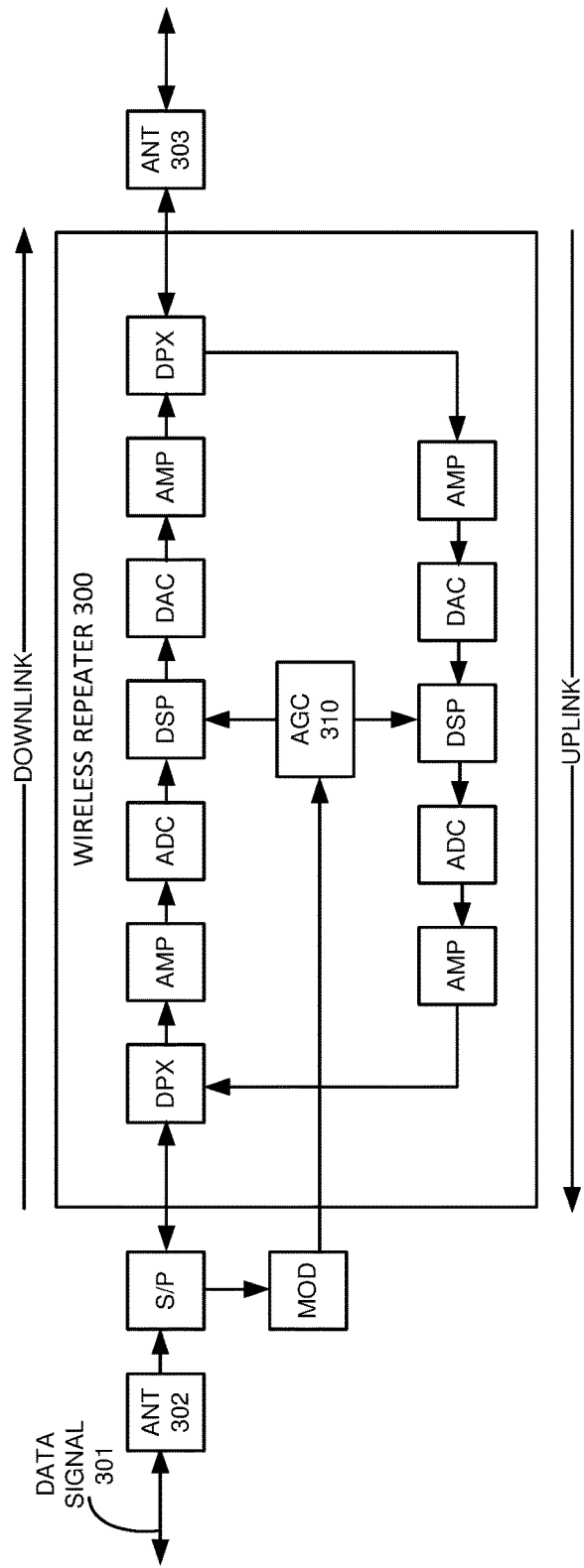
FIG. 3 is a block diagram that illustrates a wireless repeater to dynamically modify AGC thresholds in an exemplary embodiment.

FIG. 3 illustrates an exemplary embodiment of wireless repeater 300 to dynamically modify AGC thresholds. FIG. 3 includes wireless repeater 300, data signal 301, antenna systems 302-303, AGC system 310, a splitter (S/P), and a modem (MOD). Wireless repeater 300 includes duplexers (DPX), amplifiers (AMP), analog to digital converters (ADC), digital signaling processing systems (DSP), and digital to analog converters (DAC).

In operation, a data signal 301 is wirelessly received at antenna system 302. Data signal 301 is delivered through a splitter, which splits data signal 301 and transfers data signal 301 to a modem and a duplexer. The duplexer transfers data signal 301 to an amplifier, which transfers it to an analog to digital converter. The converter transfers data signal 301 to a data signal processor. After processing, data signal 301 is transferred to a digital to analog convertor, which converts data signal 301 and transfers it to an amplifier. The amplifier transfers data signal 301 to a duplexer that transfers data signal to antenna system 303. Downlink data signals go from left to right and uplink data signals go from right to left. The modem transfers data signal 301 to AGC 310, which processes data signal 301 and determines whether to apply AGC. AGC 310 transfers AGC instructions to the data signal processors, as needed. In some examples, the same AGC instruction is sent to the data signal processors in both the downlink and uplink.

Figure 4:
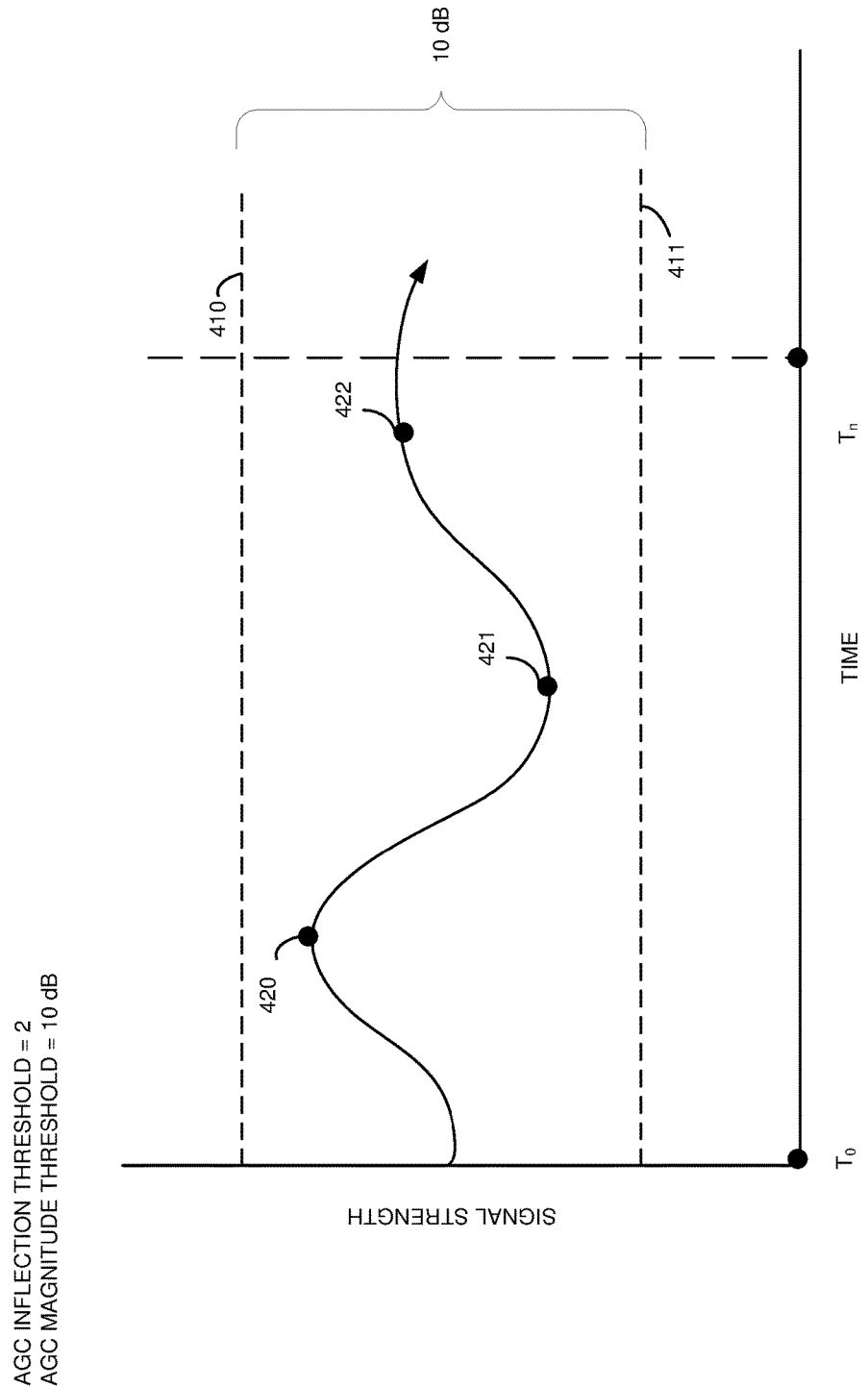
FIGS. 4-6 are data signal strength plots that illustrate different scenarios for the wireless RF system.
Figure 5:
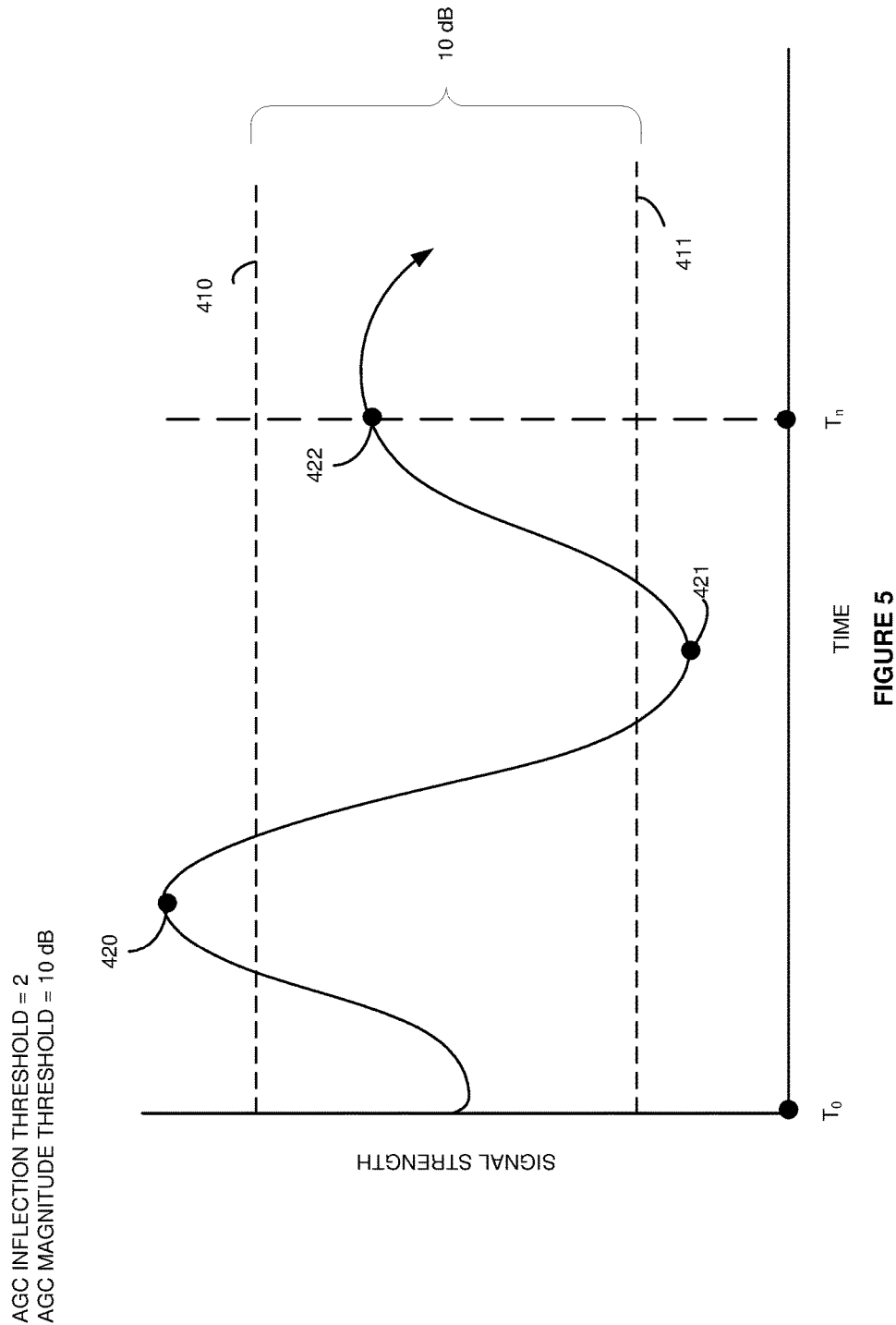
Figure 6:
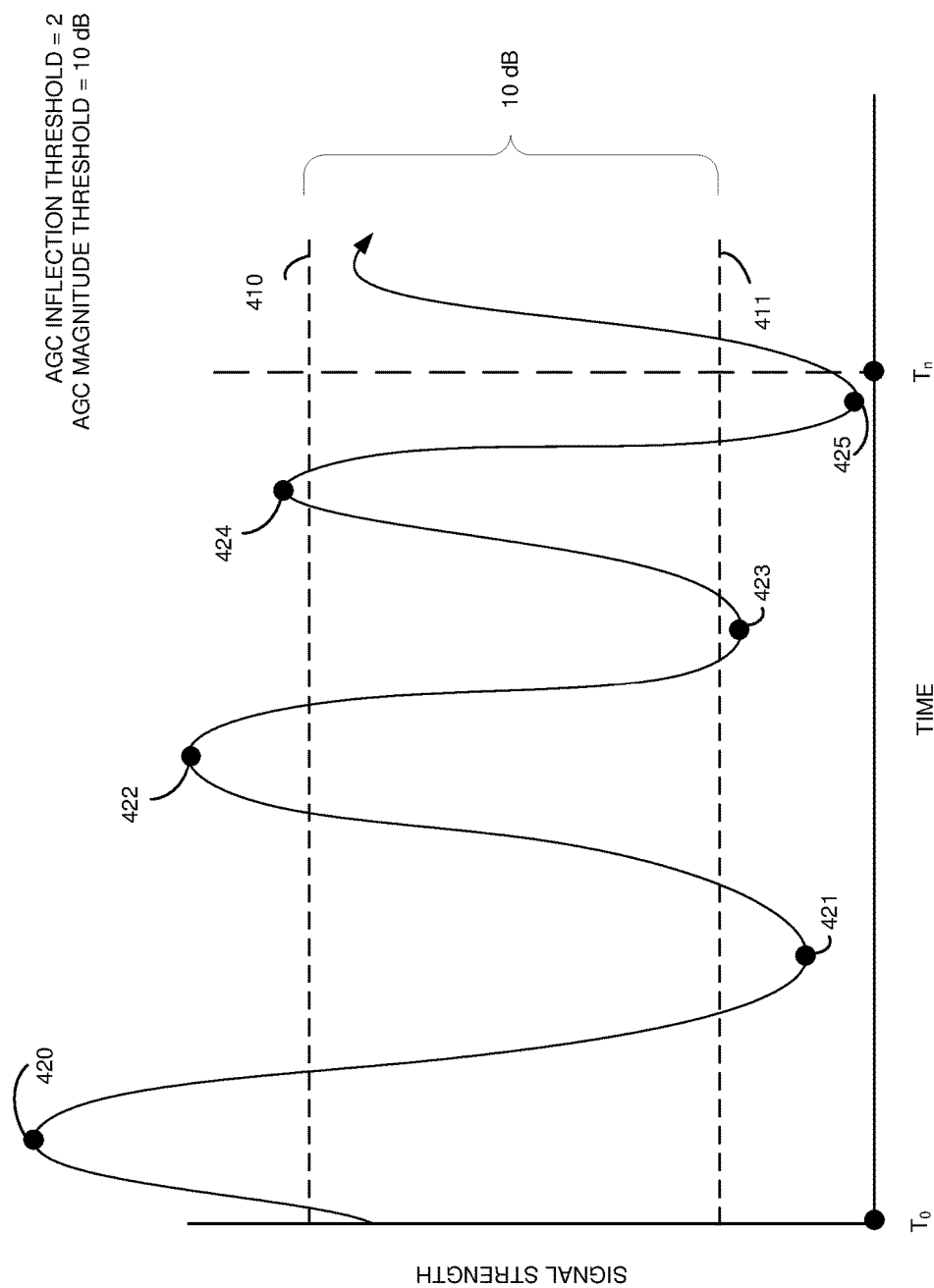

FIGS. 4-6 are data signal plots that illustrate different scenarios for the operability of AGC in wireless RF system 100 or 300.

FIG. 4 graphically represents the signal strength of a data signal received by a wireless RF system during a time window ($T_0$-$T_n$). The data signal is plotted with time on the x-axis and signal strength on the y-axis. It should be noted that the signal strength could comprise Signal to Noise Ratio (SNR), Signal to Interference plus Noise Ratio (SINR), or Reference Signal Received Quality (RSRQ).

The two horizontal dashed lines 410 and 411 represent the upper and lower AGC control thresholds, respectively. In other words, AGC will not be applied when the data signal remains within the upper and lower AGC control thresholds. For this example, the AGC signal inflection threshold is 2 inflections during time window $T_0$-$T_n$ and the AGC magnitude threshold is 10 db. In other words, if there are more than 2 inflections of 10 db or greater than the system will widen the AGC control thresholds.

Points 420-422 represent the signal inflections of the data signal. The number of inflections is the number of times the data signal is at a local high or low. As illustrated, the data signal has three inflections. The data signal reaches a maximum signal strength value at point 420 and a minimum signal strength value at point 421. However, the data signal does not exceed the upper and/or lower AGC control thresholds, therefore the signal magnitudes do not exceed the AGC magnitude threshold and AGC will not be applied to the data signal in this example.

FIG. 5 illustrates another example the data signal received by a wireless RF system in a different scenario from FIG. 4. In this example, the AGC inflection threshold is set to two and the AGC magnitude threshold is set to 10 db.

As illustrated, the signal strength plot of the data signal has three inflections, points 420-422. The data signal reaches a maximum signal strength value at point 420 and a minimum signal strength value at point 421. The data signal exceeds the upper AGC control threshold at point 420, which triggers AGC to dampen the data signal. The data signal exceeds the lower AGC threshold at point 421, which triggers AGC to apply gain to the data signal. However, the data signal did not exceed both the AGC magnitude threshold and AGC inflection threshold during the time window; therefore, the wireless RF system will not widen the AGC thresholds.

FIG. 6 illustrates another example the data signal received by a wireless RF system in a different scenario from FIGS. 4 and 5. In this example, the AGC inflection threshold is set to two and the AGC magnitude threshold is set to 10 db.

As illustrated, the signal strength plot of the data signal in FIG. 6 has six inflections (points 420-425), which exceeds the AGC inflection threshold of two. The data signal exceeds the upper AGC threshold at points 420, 422, and 424. The data signal exceeds the lower AGC threshold at points 421, 423, and 425. Also, the signal magnitudes of the inflections exceed the AGC magnitude threshold of 10 db. Therefore, the wireless RF system will widen the AGC control thresholds.

By widening the AGC control thresholds, the wireless RF system decreases the instances in which AGC will be triggered. For example, in FIG. 6, points 420, 422, and 424 trigger a dampening AGC instruction, while points 421, 423, and 425 trigger a gain AGC instruction—the constant AGC will unnecessarily increase network load to handle the AGC instructions, reducing data throughput.

It should be understood that, in the examples of FIGS. 4-6, the AGC control thresholds comprise the upper and lower limits which will trigger AGC. Therefore, if the AGC control thresholds are widened, the range of allowable signal magnitudes is increased. Conversely, if the AGC thresholds are narrowed, the range of allowable signal magnitudes may be decreased.

Referring back to FIG. 1, wireless RF system 101 comprises Radio Frequency (RF) communication circuitry and an antenna. The RF communication circuitry comprises an amplifier, filter, modulator, and signal processing circuitry. Wireless RF system may comprise a remote radio head. Further, wireless RF system comprises a Long Term Evolution (LTE) system that is compatible with cellular technology.

Wireless data signal 101 uses the air or space as the transport media. Wireless data signal 101 may use various protocols, such as Code Division Multiple Access (CDMA), Evolution Data Only (EVDO), Worldwide Interoperability for Microwave Access (WIMAX), Global System for Mobile Communication (GSM), Long Term Evolution (LTE), Wireless Fidelity (WIFI), High Speed Packet Access (HSPA), or some other wireless communication format.

What is claimed is:

1. A method of operating a wireless Radio Frequency (RF) system, the method comprising:
   the wireless RF system receiving a data signal and applying Automatic Gain Control (AGC) based on AGC thresholds;
   the wireless RF system determining a number of signal inflections each having a magnitude, wherein the number of signal inflections exceeds a number of AGC inflections threshold and the magnitudes of the signal inflections that exceed the AGC inflections threshold exceed an AGC magnitude threshold during a time period; and
   in response, the wireless RF system widening the AGC thresholds.

2. The method of claim 1 wherein the wireless RF system comprises a wireless repeater.

3. The method of claim 1 wherein the AGC thresholds comprise a maximum threshold triggering a power down command, and a minimum threshold triggering a power up command.

4. The method of claim 1 wherein the RF characteristic comprises signal strength.

5. The method of claim 1 wherein the RF characteristic comprises Signal-to-Noise Ratio (SNR).

6. The method of claim 1 wherein the RF characteristic comprises Signal-to-Interference plus Noise Ratio (SINR).

7. The method of claim 1 wherein the RF characteristic comprises Reference Signal Received Quality (RSRQ).

8. The method of claim 1 wherein if the signal inflections fall below the AGC inflection threshold, then narrowing the AGC thresholds.

9. The method of claim 1 wherein if the signal magnitudes fall below the AGC magnitude threshold, then narrowing the AGC thresholds.

10. The method of claim 1 wherein the wireless RF system comprises a Long Term Evolution (LTE) system.

11. A wireless Radio Frequency (RF) system comprising:
    an antenna system configured to wirelessly receive a data signal and apply Automatic Gain Control (AGC) based on AGC thresholds;
    the amplifier system configured to determine a number of signal inflections each having a magnitude, wherein the number of signal inflections exceeds a number of AGC inflections threshold and the magnitudes of the signal inflections that exceed the AGC inflections threshold exceed an AGC magnitude threshold during a time period; and
    in response, the amplifier system configured to widen the AGC threshold.

12. The wireless RF system of claim 11 wherein the wireless RF system comprises a wireless repeater.

13. The wireless RF system of claim 11 wherein the AGC thresholds comprise a maximum threshold triggering a power down command, and a minimum threshold triggering a power up command.

14. The wireless RF system of claim 11 wherein the RF characteristic comprises signal strength.

15. The wireless RF system of claim 11 wherein the RF characteristic comprises Signal-to-Noise Ratio (SNR).

16. The wireless RF system of claim 11 wherein the RF characteristic comprises Signal-to-Interference plus Noise Ratio (SINR).

17. The wireless RF system of claim 11 wherein the RF characteristic comprises Reference Signal Received Quality (RSRQ).

18. The wireless RF system of claim 11 wherein if the signal inflections fall below the AGC inflection threshold, then narrowing the AGC thresholds.

19. The wireless RF system of claim 11 wherein if the signal magnitudes fall below the AGC magnitude threshold, then narrowing the AGC thresholds.

20. The wireless RF system of claim 11 wherein the RF system comprises a Long Term Evolution (LTE) system.

* * * * *